United States Patent
Gill (10) Patent No.: US 6,600,638 B2
(45) Date of Patent: Jul. 29, 2003

(54) CORROSION RESISTIVE GMR AND MTJ SENSORS

(75) Inventor: Hardayal Singh Gill, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 09/954,847

(22) Filed: Sep. 17, 2001

(65) Prior Publication Data

US 2003/0053270 A1 Mar. 20, 2003

(51) Int. Cl.$^7$ .................................................. G11B 5/39
(52) U.S. Cl. ................................ 360/324.11; 360/324.2
(58) Field of Search .............................. 360/324.1–324.2

(56) References Cited

U.S. PATENT DOCUMENTS

| | | |
|---|---|---|
| 5,738,938 A | 4/1998 | Kawano et al. |
| 5,793,279 A | 8/1998 | Nepela |
| 5,796,560 A | 8/1998 | Saito et al. |
| 6,108,177 A * | 8/2000 | Gill ........................ 360/324.12 |
| 6,226,159 B1 * | 5/2001 | Pinarbasi ................ 360/324.11 |
| 6,249,406 B1 * | 6/2001 | Gill et al. ............... 360/324.11 |
| 6,356,419 B1 * | 3/2002 | Gill ........................ 360/324.11 |
| 6,430,014 B1 * | 8/2002 | Gill ........................ 360/324.12 |
| 6,519,121 B1 * | 2/2003 | Gill ........................ 360/324.11 |

* cited by examiner

Primary Examiner—Robert S. Tupper
(74) Attorney, Agent, or Firm—William D. Gill (57) ABSTRACT

Spin valve (SV) and magnetic tunnel junction (MTJ) magnetoresistive sensors are provided having magnetic layers with improved corrosion resistive properties. The SV and MTJ sensors include antiparallel (AP)-pinned layers formed of Co—Fe—X, where X is niobium (Nb), hafnium (Hf) or a mixture niobium and hafnium (NbHf) and laminated free layers formed of Co—Fe—X layers and Ni—Fe—Y layers, where Y is tantalum (Ta) or chromium (Cr). The addition of 5 to 10 atomic wt. % of Nb, Hf or NbHf to Co—Fe and 5 to 10 atomic wt. % Ta or Cr to Ni—Fe improves corrosion resistance by a self-passivation effect of the these metals. Addition of these metals to the magnetic layers reduces grain size of the layers resulting in increased electrical resistance leading to reduced sense current shunting and increased deltaR/R.

26 Claims, 6 Drawing Sheets

CORROSION RESISTIVE GMR AND MTJ SENSORS

BACKGROUND OF THE INVENTION

1. Field of the Invention

This invention relates in general to giant magnetoresistive (GMR) and magnetic tunnel junction (MTJ) sensors for reading information signals from a magnetic medium and, in particular, to GMR and MTJ sensors having improved corrosion resistive properties.

2. Description of the Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect.

Figure 1:
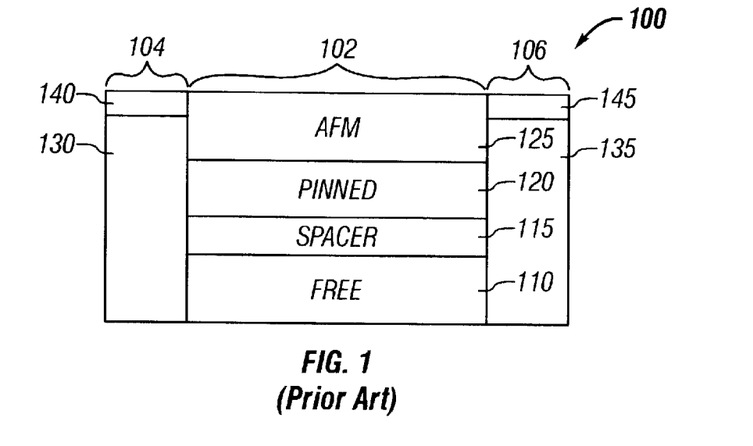
FIG. 1 is an air bearing surface view, not to scale, of a prior art SV sensor.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of SV sensor 100. IBM's U.S. Pat. No. 5,206,590 granted to Dieny et al., incorporated herein by reference, discloses a GMR sensor operating on the basis of the SV effect.

Another type of spin valve sensor is an antiparallel (AP) spin valve sensor. The AP-pinned valve sensor differs from the simple simple spin valve sensor in that an AP-pinned structure has multiple thin film layers instead of a single pinned layer. The AP-pinned structure has an antiparallel coupling (APC) layer sandwiched between first and second ferromagnetic pinned layers. The first pinned layer has its magnetization oriented in a first direction by exchange coupling to the antiferromagnetic pinning layer. The second pinned layer is immediately adjacent to the free layer and is antiparallel exchange coupled to the first pinned layer because of the minimal thickness (in the order of 8 Å) of the APC layer between the first and second pinned layers. Accordingly, the magnetization of the second pinned layer is oriented in a second direction that is antiparallel to the direction of the magnetization of the first pinned layer.

The AP-pinned structure is preferred over the single pinned layer because the magnetizations of the first and second pinned layers of the AP-inned structure subtractively combine to provide a net magnetization that is less than the magnetization of the single pinned layer. The direction of the net magnetization is determined by the thicker of the first and second pinned layers. A reduced net magnetization equates to a reduced demagnetization field from the AP-pinned structure. Since the antiferromagnetic exchange coupling is inversely proportional to the net pinning magnetization, this increases exchange coupling between the first pinned layer and the antiferromagnetic pinning layer. The AP-pinned spin valve sensor is described in commonly assigned U.S. Pat. No. 5,465,185 to Heim and Parkin which is incorporated by reference herein.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

Figure 2:
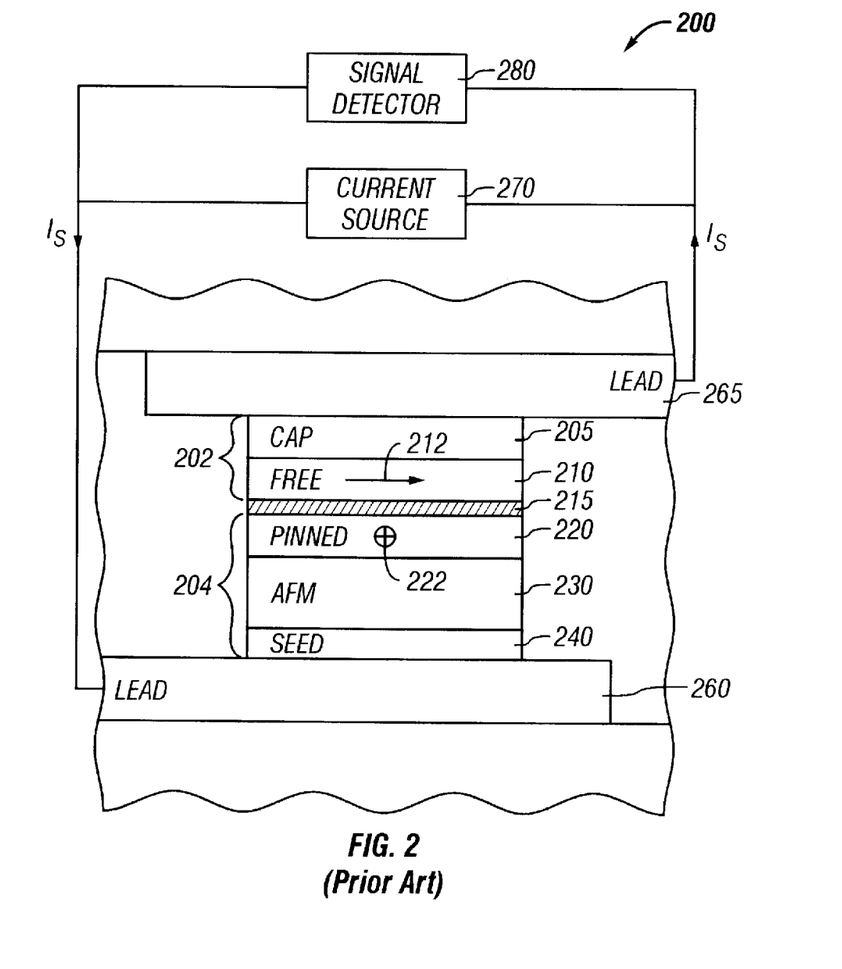
FIG. 2 is an air bearing surface view, not to scale, of a prior art MTJ sensor.

FIG. 2 shows a prior art MTJ sensor 200 comprising a first electrode 204, a second electrode 202, and a tunnel barrier layer 215. The first electrode 204 comprises a pinned layer (pinned ferromagnetic layer) 220, an antiferromagnetic (AFM) layer 230, and a seed layer 240. The magnetization of the pinned layer 220 fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

Figure 3:
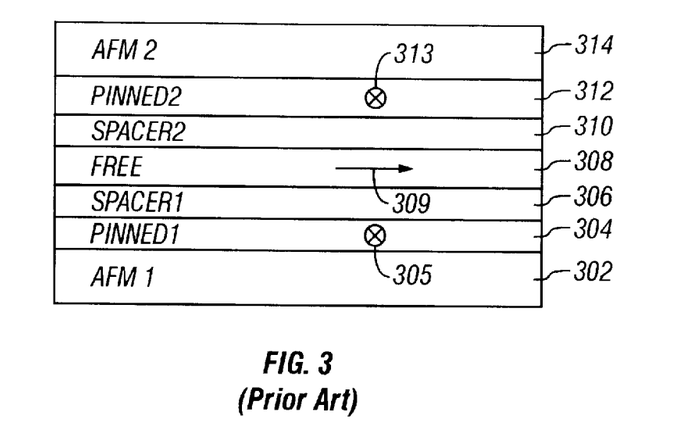
FIG. 3 is an air bearing surface view, not to scale, of a prior art dual spin valve sensor.

Dual SV or MTJ sensors can provide increased magnetoresistive response to a signal field due to the additive response of the dual sensors. IBM's U.S. Pat. No. 5,287,238 granted to Baumgart et al. discloses a dual SV sensor. FIG. 3 shows a dual spin valve sensor 300 wherein the spin valve structure is doubled symmetrically with respect a ferromagnetic free layer 308. The structure of the dual spin valve sensor is AFM1/Pinned1/Spacer1/Free/Spacer2/Pinned2/AFM2 providing ferromagnetic first and second pinned layers 304 and 312 separated by nonmagnetic first and second spacer layers 306 and 310, respectively, from a ferromagnetic free layer 308 which allows utilization of the conduction electrons scattered in both directions from the intermediate free layer 308. The directions of magnetization 305 and 313 (tails of arrows pointing into the plane of the paper) of the first and second pinned layers 304 and 312 are fixed parallel to each other by adjacent first and second antiferromagnetic layers 302 and 314, respectively. The direction of magnetization 309 of the free layer 308 is set at an angle of about 90° with respect to the magnetizations of the two pinned layers and is allowed to rotate freely in response to an applied magnetic field.

The design of GMR and MTJ sensors typically includes a stack of metallic layers deposited on top of each other. During the fabrication process of the magnetic heads, an edge of the sensor stack is lapped to form part of an air bearing surface (ABS) facing the magnetic disk surface on which magnetic data is stored. At the ABS the lapped edge of the stack of metallic layers is exposed to air, humidity and any contaminants present in the disk file enclosure. Oxidation and corrosion of the metallic layers at the ABS can cause significant degradation of the sensor performance and reliability.

Therefore, there is a need for GMR and MTJ sensors having improved corrosion resistive properties of the metallic layers without adversely affecting their GMR properties.

SUMMARY OF THE INVENTION

It is an object of the present invention to disclose GMR and MTJ sensors comprising magnetic layers having improved corrosion resistive properties.

It is another object of the present invention to disclose GMR and MTJ sensors comprising pinned layers formed of Co—Fe—X, where X is niobium (Nb), hafnium (Hf) or a mixture of niobium and hafnium (NbHf), having improved corrosion resistive properties.

It is yet another object of the present invention to disclose GMR and MTJ sensors comprising free layers formed of Ni—Fe—Y, where Y is tantalum (Ta) or chromium (Cr), having improved corrosion resistive properties.

In accordance with the principles of the present invention, there are disclosed several embodiments of GMR and MTJ sensors including an antiparallel (AP)-pinned layer structure and a laminated free layer structure. The AP-pinned layer comprises a first ferromagnetic (FM1) layer, a second ferromagnetic layer (FM2) layer and an antiparallel coupling (APC) layer sandwiched between the FM1 and FM2 layers. The FM1 and FM2 layers are formed of $(Co-Fe)_a-X_b$, where X=Nb, Hf or NbHf, $90\% \leq a \leq 95\%$, $5\% \leq b \leq 10\%$ and a+b=100%. The addition of 5 to 10 atomic wt. % of Nb, Hf or NbHf into Co—Fe improves corrosion resistance by a well-known self-passivation effect of the these metals due to formation of a thin surface oxide which protects the metal surface from further degradation. Addition of these metals results in a reduced grain size of the deposited FM1 and FM2 layers leading to an increase of the electrical resistivity of the layers. This increase in layer resistivity reduces sense current shunting through the AP-pinned structure resulting in an increased deltaR/R for the GMR sensors.

The laminated free layer structure comprises a first sublayer and a second sublayer. The first sublayer is formed of $(Co-Fe)_a-X_b$, where X=Nb, Hf or NbHf, $90\% \leq a \leq 95\%$, $5\% \leq b \leq 10\%$ and a+b=100%. The second sublayer is formed of $(Ni-Fe)_a-Y_b$, where Y=Ta or Cr, $90\% \leq a \leq 95\%$, $5\% \leq b \leq 10\%$ and a+b=100%. The addition of 5 to 10 atomic wt. % of Nb, Hf or NbHf into Co—Fe and 5 to 10 atomic wt. % of Ta or Cr into Ni—Fe also improves the corrosion resistance and increases the electrical resistivity of the first and second sublayers, respectively, of the freelayer structure of the sensors.

The above as well as additional objects, features, and advantages of the present invention will become apparent in the following detailed description.

BRIEF DESCRIPTION OF THE DRAWINGS

For a fuller understanding of the nature and advantages of the present invention, as well as of the preferred mode of use, reference should be made to the following detailed description read in conjunction with the accompanying drawings. In the following drawings, like reference numerals desigate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 4:
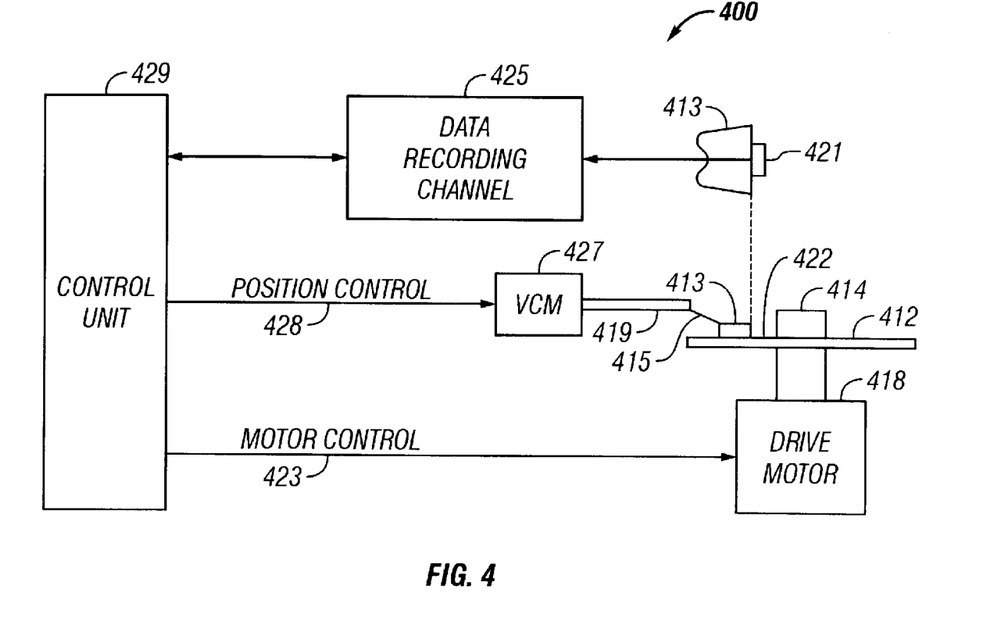
FIG. 4 is a simplified diagram of a magnetic recording disk drive system using the GMR or MTJ sensors of the present invention.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on the disk 412.

At least one slider 413 is positioned on the disk 412, each slider 413 supporting one or more magnetic read/write heads 421 where the head 421 incorporates the SVT sensor of the present invention. As the disks rotate, the slider 413 is moved radially in and out over the disk surface 422 so that the heads 421 may access different portions of the disk where desired data is recorded. Each slider 413 is attached to an actuator arm 419 by means of a suspension 415. The suspension 415 provides a slight spring force which biases the slider 413 against the disk surface 422. Each actuator arm 419 is attached to an actuator 427. The actuator as shown in FIG. 4 may be a voice coil motor (VCM). The VCM comprises a coil movable within a fixed magnetic field, the direction and speed of the coil movements being controlled by the motor current signals supplied by a controller 429.

During operation of the disk storage system, the rotation of the disk 412 generates an air bearing between the slider 413 (the surface of the slider 413 which includes the head 421 and faces the surface of the disk 42 is referred to as an air bearing surface (ABS)) and the disk surface 422 which exerts an upward force or lift on the slider. The air bearing thus counter-balances the slight spring force of the suspension 415 and supports the slider 43 off and slightly above the disk surface by a small, substantially constant spacing during normal operation.

The various components of the disk storage system are controlled in operation by control signals generated by the control unit 429, such as access control signals and internal clock signals. Typically, the control unit 429 comprises logic control circuits, storage chips and a microprocessor. The control unit 429 generates control signals to control various system operations such as drive motor control signals on line 423 and head position and seek control signals on line 428. The control signals on line 428 provide the desired current profiles to optimally move and position the slider 413 to the desired data track on the disk 412. Read and write signals are communicated to and from the read/write heads 421 by means of the recording channel 425. Recording channel 425 may be a partial response maximum likelihood (PMRL) channel or a peak detect channel. The design and implementation of both channels are well known in the art and to persons skilled in the art. In the preferred embodiment, recording channel 425 is a PMRL channel.

The above description of a typical magnetic disk storage system, and the accompanying illustration of FIG. 4 are for representation purposes only. It should be apparent that disk storage systems may contain a large number of disks and actuator arms, and each actuator arm may support a number of sliders.

Figure 5A:
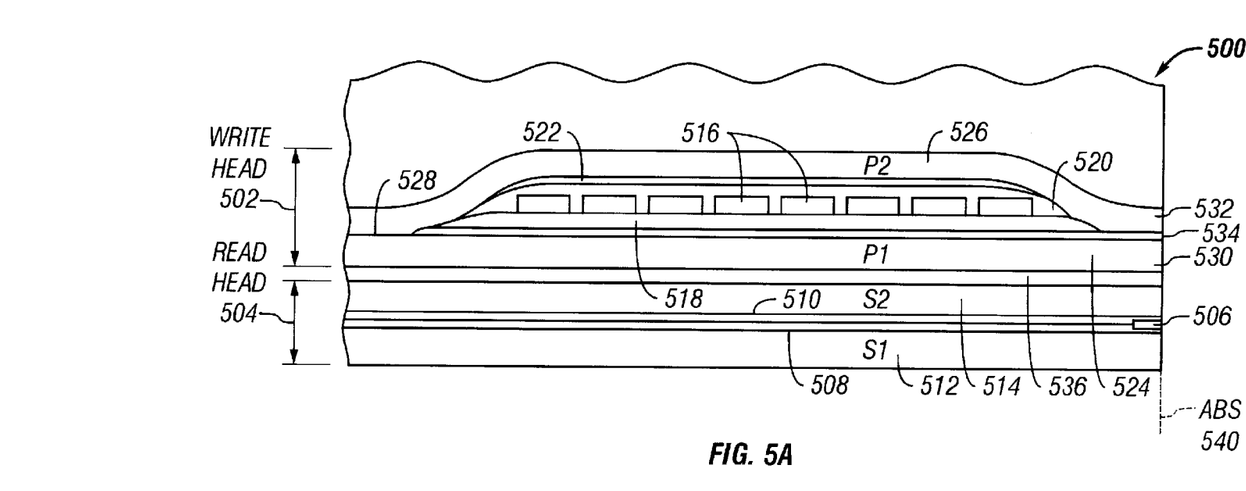
FIG. 5a is a vertical cross-section view, not to scale, of a "piggyback" read/write magnetic head.

FIG. 5a is a side cross-sectional elevation view of a "piggyback" magnetic read/write head 500, which includes a write head portion 502 and a read head portion 504, the read head portion employing a GMR or MTJ sensor 506 according to the present invention. The sensor 506 is sandwiched between nonmagnetic insulative first and second read gap layers 508 and 510, and the read gap layers are sandwiched between ferromagnetic first and second shield layers 512 and 514. In response to external magnetic fields, the resistance of the sensor 506 changes. A sense current Is conducted through the sensor causes these resistance changes to be manifested as potential changes. These potential changes are then processed as readback signals by the processing circuitry of the data recording channel 446 shown in FIG. 4.

The write head portion 502 of the magnetic read/write head 500 includes a coil layer 516 sandwiched between first and second insulation layers 518 and 520. A third insulation layer 522 may be employed for planarizing the head to eliminate ripples in the second insulation layer 520 caused by the coil layer 516. The first, second and third insulation layers are referred to in the art as an insulation stack. The coil layer 516 and the first, second and third insulation layers 518, 520 and 522 are sandwiched between first and second pole piece layers 524 and 526. The first and second pole piece layers 524 and 526 are magnetically coupled at a back gap 528 and have first and second pole tips 530 and 532 which are separated by a write gap layer 534 at the ABS 540. An insulation layer 536 is located between the second shield layer 514 and the first pole piece layer 524. Since the second shield layer 514 and the first pole piece layer 54 are separate layers this read/write head is known as a "piggyback" head.

Figure 5B:
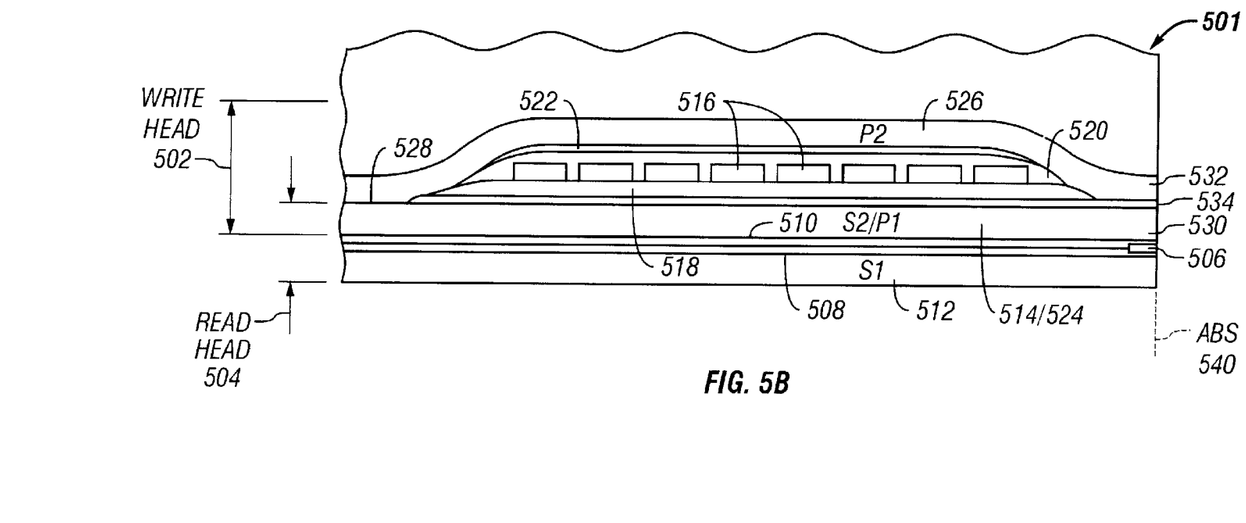
FIG. 5b is a vertical cross-section view, not to scale, of a "merged" read/write magnetic head.

FIG. 5b is the same as FIG. 5a except the second shield layer 514 and the first pole piece layer 524 are a common layer. This type of read/write head is known as a "merged" head 501. The insulation layer 536 of the piggyback head in FIG. 5a is omitted in the merged head 501 of FIG. 5b.

EXAMPLE 1

Figure 6:
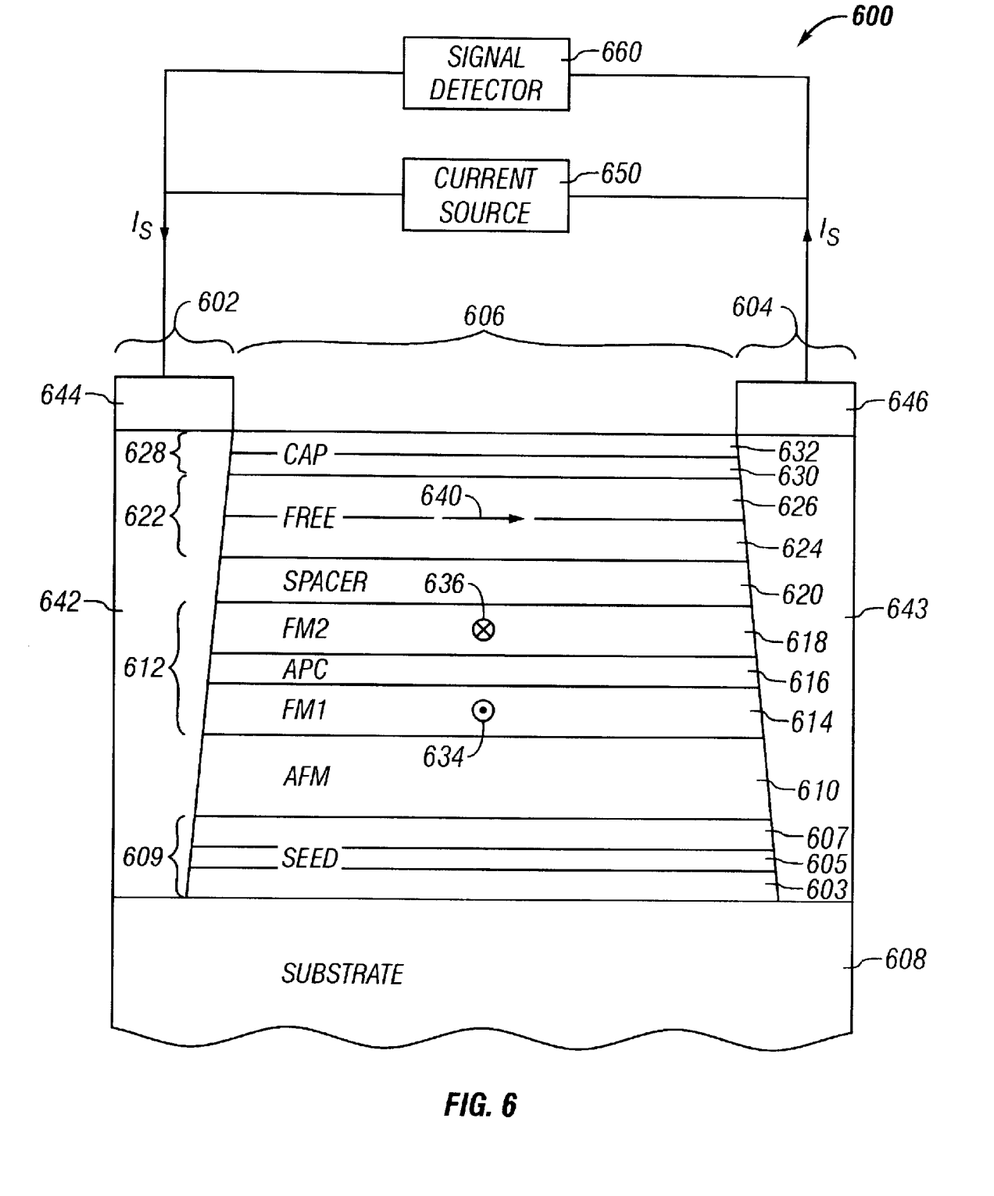
FIG. 6 is an air bearing surface view, not to scale, of an embodiment of a GMR sensor of the present invention.

FIG. 6 shows an air bearing surface (ABS) view, not to scale, of a first example of a GMR spin valve (SV) sensor 600 according to a preferred embodiment of the present invention. The SV sensor 600 comprises passive end regions 602 and 604 separated from each other by an active central region 606. The substrate 608 can be any suitable substance, including glass, semiconductor material, or a ceramic material such as alumina ($Al_2O_3$). The seed layer 609 is a layer deposited to modify the crystallographic texture or grain size of the subsequent layers, and may not be needed depending on the subsequent layer. For the embodiment of the SV sensor 600, the seed layer 609 comprises a trilayer structure deposited on the substrate. First, second and third sublayers 603, 605 and 607 are sequentially deposited on the substrate 608 in the central region 606. An antiferromagnetic (AFM) layer 610 is deposited over the third sublayer 607 to the thickness at which the desired exchange properties are achieved, typically 100–500 Å. A laminated antiparallel (AP)-pinned layer 612 is formed on the AFM layer 610. The AP-pinned layer 612 comprises a first ferromagnetic layer (FM1) 614, a second ferromagnetic layer (FM2) 618 and an antiparallel coupling (APC) layer 616 disposed between the FM1 layer 614 and the FM2 layer 618. The APC layer is formed of a nonmagnetic material, preferably ruthenium (Ru), that allows the FM1 layer 614 and the FM2 layer 618 to be strongly coupled together antiferromagnetically. A laminated ferromagnetic free layer 622 including a first sublayer 624 and a second sublayer 626 is separated from the AP-pinned layer 612 by a nonmagnetic electrically conducting spacer layer 620. The magnetization of the free layer 622 is preferably parallel to the ABS in the absence of an external field as indicated by the arrow 640 representing the magnetization of the laminated first and second sublayers 624 and 626. A laminated cap layer 628 comprising first and second sublayers 630 and 632, formed on the free layer 622 completes the central region 606 of the SV sensor 600.

The SV sensor 600 further comprises bias layers 642 and 643 formed on the end regions 602 and 604, respectively, for providing a longitudinal bias field to the free layer 622 to ensure a single magnetic domain state in the free layer. Lead layers 644 and 646 are also deposited on the end regions 602 and 604, respectively, to provide electrical connections for the flow of a sensing current $I_s$ from a current source 650 to the SV sensor 600. A signal detector 660 which is electrically connected to leads 644 and 646 senses the change in resistance due to changes induced in the free layer 622 by the external magnetic field (e.g., field generated by a data bit stored on a disk). The external magnetic field acts to rotate the direction of magnetization of the free layer 622 relative to the direction of magnetization of the pinned FM2 layer 618 which is preferably pinned perpendicular to the ABS. The signal detector 660 preferably comprises a partial response maximum likelihood (PRML) recording channel for processing the signal detected by SV sensor 600. Alternatively, a peak detect channel or a maximum likelihood channel (e.g., 1,7 ML) may be used. The design and implementation of the aforementioned channels are known to those skilled in the art. The signal detector 660 also includes other supporting circuitries such as a preamplifier (electrically placed between the sensor and the channel) for conditioning the sensed resistance changes as is known to those skilled in the art.

The SV sensor 600 is fabricated in a magnetron sputtering or an ion beam sputtering system to sequentially deposit the multilayer structure shown in FIG. 6. The sputter deposition process is carried out in the presence of a longitudinal magnetic field of about 40 Oe. The seed layer 609 is formed on the substrate 608 by sequentially depositing the first sublayer 603 of $Al_2O_3$ having a thickness of about 30 Å, the second sublayer 605 of Ni—Mn—O having a thickness of about 30 Å and the third sublayer 607 of Ni—Fe—Cr having a thickness of about 25 Å. The AFM layer 610 formed of Pt—Mn having a thickness of about 150 Å is deposited on the third sublayer 607 of the seed layer 609.

The AP-pinned layer 612, the spacer layer 620, the laminated free layer 622 and the laminated cap layer 628 are sequentially deposited on the AFM layer 610 in the central region 606. The FM1 layer 614 of Co—Fe—X, where X is niobium (Nb) or hafnium (Hf) or a combination of niobium and hafnium (NbHf), having a thickness of about 13 Å is deposited on the AFM layer 610. The APC layer 616 of ruthenium (Ru) having a thickness of about 8 Å is deposited on the FM1 layer 614. The FM2 layer 618 of Co—Fe—X having a thickness of about 20 Å is deposited on the APC layer 616.

The nonmagnetic conducting spacer layer 620 is formed of copper oxide (CuO) having a thickness of about 20 Å deposited on the FM2 layer 618. Alternatively, the spacer layer 620 may be formed of copper (Cu), silver (Ag), gold (Au) or of alloys of Cu, Ag and Au. The laminated free layer 622 comprises the first sublayer 624 of Co—Fe—X having a thickness of about 15 Å deposited on the spacer layer 620 and the second sublayer 626 of Ni—Fe—Y, where Y is tantalum (Ta) or chromium (Cr), having a thickness of 15 Å deposited on the first sublayer 624. The cap layer 628 is formed of a first sublayer of CuO having a thickness of about 6 Å deposited on the second sublayer 626 of the free layer 622 and a second sublayer 632 of TaO having a thickness of about 40 Å deposited on the first sublayer 630 of the cap layer 632.

After the deposition of the central portion 606 is completed, the sensor is annealed in the presence of a magnetic field of about 800 Oe oriented in the transverse direction to the ABS and is then cooled while still in the magnetic field to set the exchange coupling of the AFM layer 610 with the laminated AP-pinned layer 612 transverse to the ABS. The FM1 layer 614 has a surface which interfaces with a surface of the AFM layer 610 so that the AFM layer pins the magnetization 634 (represented in FIG. 6 by the head of an arrow pointing out of the plane of the paper) of the FM1 layer 614 in a direction perpendicular to and toward the ABS. The magnetization of the FM1 layer 614 is pinned in this direction by exchange coupling with the AFM layer 610. The APC layer 616 is very thin (about 8 Å) which allows an antiferromagnetic exchange coupling between the FM1 layer 614 and the FM2 layer 618. Accordingly, the magnetization 636 (represented by the tail of an arrow pointing into the plane of the paper) of the FM2 layer 618 is directed in an opposite direction to the magnetization 634 of the FM1 layer 614, namely perpendicular to and away from the ABS. Alternatively, the magnetization 634 of the FM1 layer 614 may be set in an opposite direction (perpendicular to and away from the ABS) so that the magnetization 634 points into the plane of the paper. The magnetization 636 of the FM2 layer 618 will then point out of the plane of the paper due to the antiparallel coupling across the APC layer 616.

EXAMPLE 2

Figure 7:
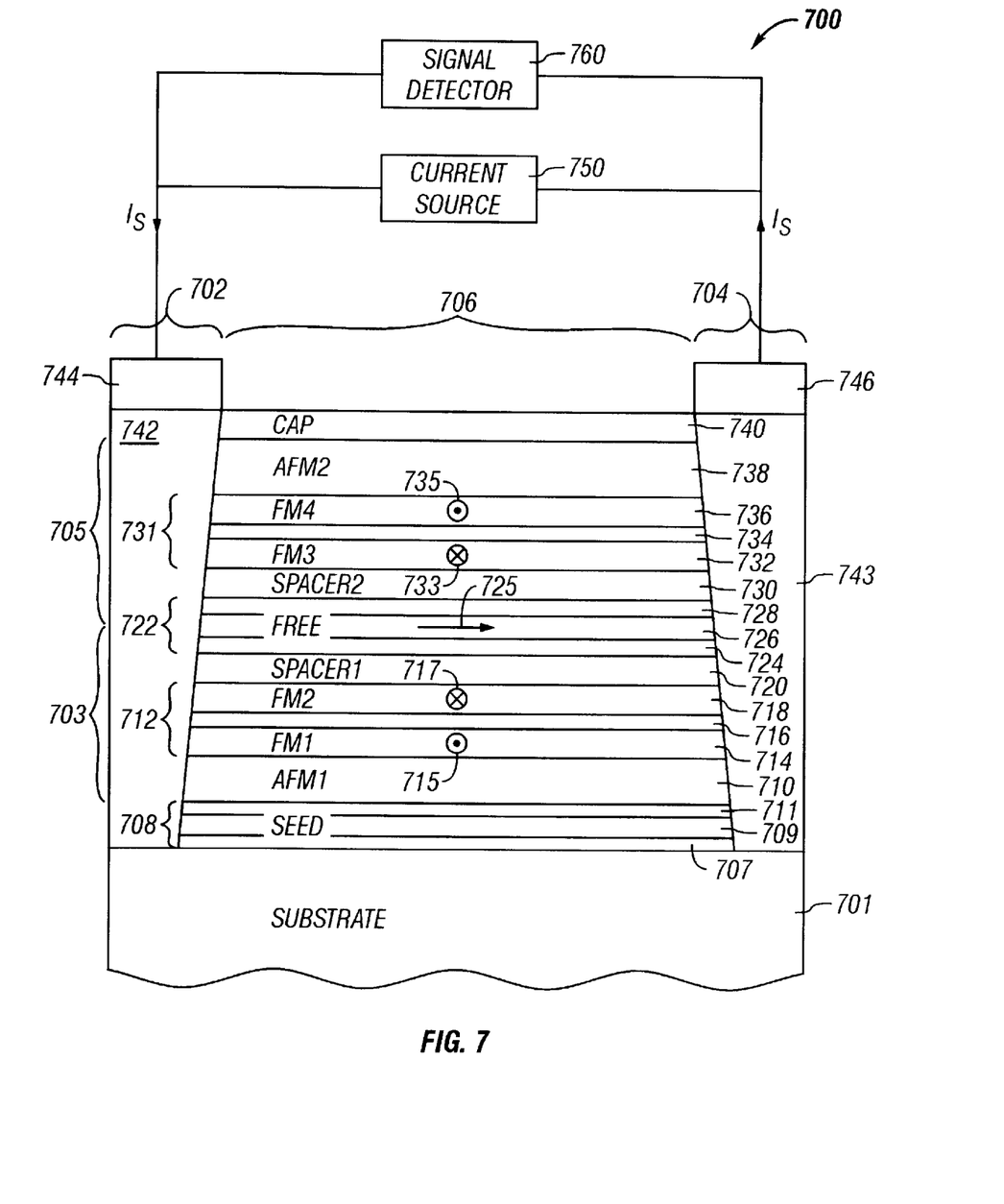
FIG. 7 is an air bearing surface view, not to scale, of an embodiment of a dual GMR sensor of the present invention.

FIG. 7 shows an air bearing surface (ABS) view, not to scale, of a second example of a GMR dual spin valve (SV) sensor 700 according to a another embodiment of the present invention. The dual SV sensor 700 comprises passive end regions 702 and 704 separated from each other by an active central region 706. The substrate 708 can be any suitable substance, including glass, semiconductor material, or a ceramic material such as alumina ($Al_2O_3$). The seed layer 708 is a layer deposited to modify the crystallographic texture or grain size of the subsequent layers, and may not be needed depending on the subsequent layer. For the embodiment of the dual SV sensor 700, the seed layer 708 comprises a trilayer structure deposited on the substrate. First, second and third sublayers 707, 709 and 711 are sequentially deposited on the substrate 701 in the central region 706. First and second SV sensors 703 and 705 are sequentially deposited on the seed layer in the the central region 706 to form the dual SV structure. A first antiferromagnetic (AFM1) layer 710 is deposited over the third sublayer 711 to the thickness at which the desired exchange properties are achieved, typically 100–500 Å. A laminated first antiparallel (AP)-pinned layer 712 is formed on the AFM layer 710. The first AP-pinned layer 712 comprises a first ferromagnetic layer (FM1) 714, a second ferromagnetic layer (FM2) 718 and an antiparallel coupling (APC) layer 716 disposed between the FM1 layer 714 and the FM2 layer 718. The APC layer is formed of a nonmagnetic material, preferably ruthenium (Ru), that allows the FM1 layer 714 and the FM2 layer 718 to be strongly coupled together antiferromagnetically. A laminated ferromagnetic free layer 722 including a first sublayer 724, a second sublayer 726 and a third sublayer 728 is separated from the first AP-pinned layer 712 by a nonmagnetic electrically conducting first spacer layer 720. The magnetization of the free layer 722 is preferably parallel to the ABS in the absence of an external field as indicated by the arrow 725 representing the magnetization of the laminated first, second and third sublayers 724, 726 and 728. A laminated second AP-pinned layer 731 is separated from the laminated free layer 722 by a second spacer layer 730 formed on the third sublayer 728. The second AP-pinned layer 731 comprises a third ferromagnetic layer (FM3) 732, a fourth ferromagnetic layer (FM4) 736 and an antiparallel coupling (APC) layer 734 disposed between the FM3 layer 732 and the FM4 layer 736. The APC layer is formed of a nonmagnetic material, preferably ruthenium (Ru), that allows the FM3 layer 732 and the FM4 layer 736 to be strongly coupled together antiferromagnetically. A second antiferromagnetic (AFM2) layer 738 is deposited over the FM4 layer 736 to the thickness at which the desired exchange properties are achieved, typically 100–500 Å. A cap layer 740, formed on the AFM2 layer 738 completes the central region 706 of the dual SV sensor 700.

The dual SV sensor 700 further comprises bias layers 742 and 743 formed on the end regions 702 and 704, respectively, for providing a longitudinal bias field to the free layer 722 to ensure a single magnetic domain state in the free layer. Lead layers 744 and 746 are also deposited on the end regions 702 and 704, respectively, to provide electrical connections for the flow of a sensing current $I_S$ from a current source 750 to the dual SV sensor 700. A signal detector 760 which is electrically connected to leads 744 and 746 senses the change in resistance due to changes induced in the free layer 722 by the external magnetic field (e.g., field generated by a data bit stored on a disk). The external magnetic field acts to rotate the direction of magnetization of the free layer 722 relative to the direction of magnetization of the pinned FM2 layer 718 and the pinned FM3 layer 732 which are preferably pinned perpendicular to the ABS.

The dual SV sensor 700 is fabricated in a magnetron sputtering or an ion beam sputtering system to sequentially deposit the multilayer structure shown in FIG. 7. The sputter deposition process is carried out in the presence of a longitudinal magnetic field of about 40 Oe. The seed layer 708 is formed on the substrate 701 by sequentially depositing the first sublayer 707 of $Al_2O_3$ having a thickness of about 30 Å, the second sublayer 709 of Ni—Mn—O having a thickness of about 30 Å and the third sublayer 711 of Ni—Fe—Cr having a thickness of about 25 Å. The AFM1 layer 710 of Pt—Mn having a thickness of about 150 Å is deposited on the third sublayer 711. The FM1 layer 714 of Co—Fe—X, where X is niobium (Nb) or hafnium (Hf) or a combination of niobium and hafnium (NbHf), having a thickness of about 13 Å is deposited on the AFM1 layer 710. The APC layer 716 of ruthenium (Ru) having a thickness of about 8 Å is deposited on the FM1 layer 714. The FM2 layer 718 of Co—Fe—X having a thickness of about 20 Å is deposited on the APC layer 716.

The first AP-pinned layer 712, the first spacer layer 720, the laminated free layer 722, the second spacer layer 730, the second AP-pinned layer 731, the AFM2 layer 738 and the cap layer 740 are sequentially deposited on the AFM1 layer 710 in the central region 706. The FM1 layer 714 of Co—Fe—X, where X is niobium (Nb) or hafnium (Hf), having a thickness of about 13 Å is deposited on the AFM1 layer 710. The APC layer 716 of ruthenium (Ru) having a thickness of about 8 Å is deposited on the FM1 layer 714. The FM2 layer 718 of Co—Fe—X having a thickness of about 20 Å is deposited on the APC layer 716.

The nonmagnetic conducting first spacer layer 720 is formed of copper oxide (CuO) having a thickness of about 20 Å deposited on the FM2 layer 718. Alternatively, the first spacer layer 720 may be formed of copper (Cu), silver (Ag), gold (Au) or of alloys of Cu, Ag and Au. The laminated free layer 722 comprises the first sublayer 724 of Co—Fe—X having a thickness of about 10 Å deposited on the first spacer layer 720, the second sublayer 726 of Ni—Fe—Y, where Y is tantalum (Ta) or chromium (Cr), having a thickness of about 10 Å deposited on the first sublayer 724 and the third sublayer 728 of Co—Fe—X having a thickness of about 10 Å deposited on the second sublayer 726. The second spacer layer 720 is formed of copper oxide (CuO) having a thickness of about 20 Å deposited on the third sublayer 728. Alternatively, the second spacer layer 730 may be formed of copper (Cu), silver (Ag), gold (Au) or of alloys of Cu, Ag and Au. The FM31 layer 732 of Co—Fe—X, where X is niobium (Nb) or hafnium (Hf) or a combination of niobium and hafnium (NbHf), having a thickness of about 20 Å is deposited on the second spacer layer 730. The APC layer 734 of ruthenium (Ru) having a thickness of about 8 Å is deposited on the FM3 layer 732. The FM4 layer 736 of Co—Fe—X having a thickness of about 13 Å is deposited on the APC layer 734. The AFM2 layer 738 of Pt—Mn having a thickness of about 150 Å is deposited on the FM4 layer 736. The cap layer 740 formed of tantalum (Ta) having a thickness of about 40 Å deposited on the AFM2 layer 738 completes the central portion 706 of the dual SV sensor 700.

After the deposition of the central portion 706 is completed, the sensor is annealed in the presence of a magnetic field of about 800 Oe oriented in the transverse direction to the ABS and is then cooled while still in the magnetic field to set the exchange coupling of the AFM1 and AFM2 layers 710 and 738 with the laminated first and second AP-pinned layers 712 and 738 transverse to the ABS. The FM1 layer 714 has a surface which interfaces with a surface of the AFM1 layer 710 so that the AFM layer pins the magnetization 715 (represented in FIG. 7 by the head of an arrow pointing out of the plane of the paper) of the FM1 layer 714 in a direction perpendicular to and toward the ABS. The magnetization of the FM1 layer 714 is pinned in this direction by exchange coupling with the AMF1 layer 710. The APC layer 716 is very thin (about 8 Å) which allows an antiferromagnetic exchange coupling between the FM1 layer 714 and the FM2 layer 718. Accordingly, the magnetization 717 (represented by the tail of an arrow pointing into the plane of the paper) of the FM2 layer 718 is directed in an opposite direction to the magnetization 715 of the FM1 layer 714, namely perpendicular to and away from the ABS. Similarly, the FM4 layer 736 has a surface which interfaces with a surface of the AFM2 layer 738 so that the AFM2 layer pins the magnetization 735 (represented in FIG. 7 by the head of an arrow pointing out of the plane of the paper) of the FM4 layer 736 in a direction perpendicular to and toward the ABS. The magnetization of the FM4 layer 736 is pinned in this direction by exchange coupling with the AFM2 layer 738. The APC layer 734 is very thin (about 8 Å) which allows an antiferromagnetic exchange coupling between the FM4 layer 736 and the FM3 layer 732. Accordingly, the magnetization 733 (represented by the tail of an arrow pointing into the plane of the paper) of the FM3 layer 732 is directed in an opposite direction to the magnetization 735 of the EM4 layer 736, namely perpendicular to and away from the ABS.

Alternatively, the magnetizations 715 and 735 of the FM1 and FM4 layers 714 and 736, respectively, may be set in an opposite direction (perpendicular to and away from the ABS) so that the magnetizations 715 and 735 point into the plane of the paper. The magnetizations 717 and 733 of the FM2 and FM3 layers 718 and 732, respectively, will then point out of the plane of the paper due to the antiparallel coupling across the APC layers 716 and 734.

EXAMPLE 3

Figure 8:
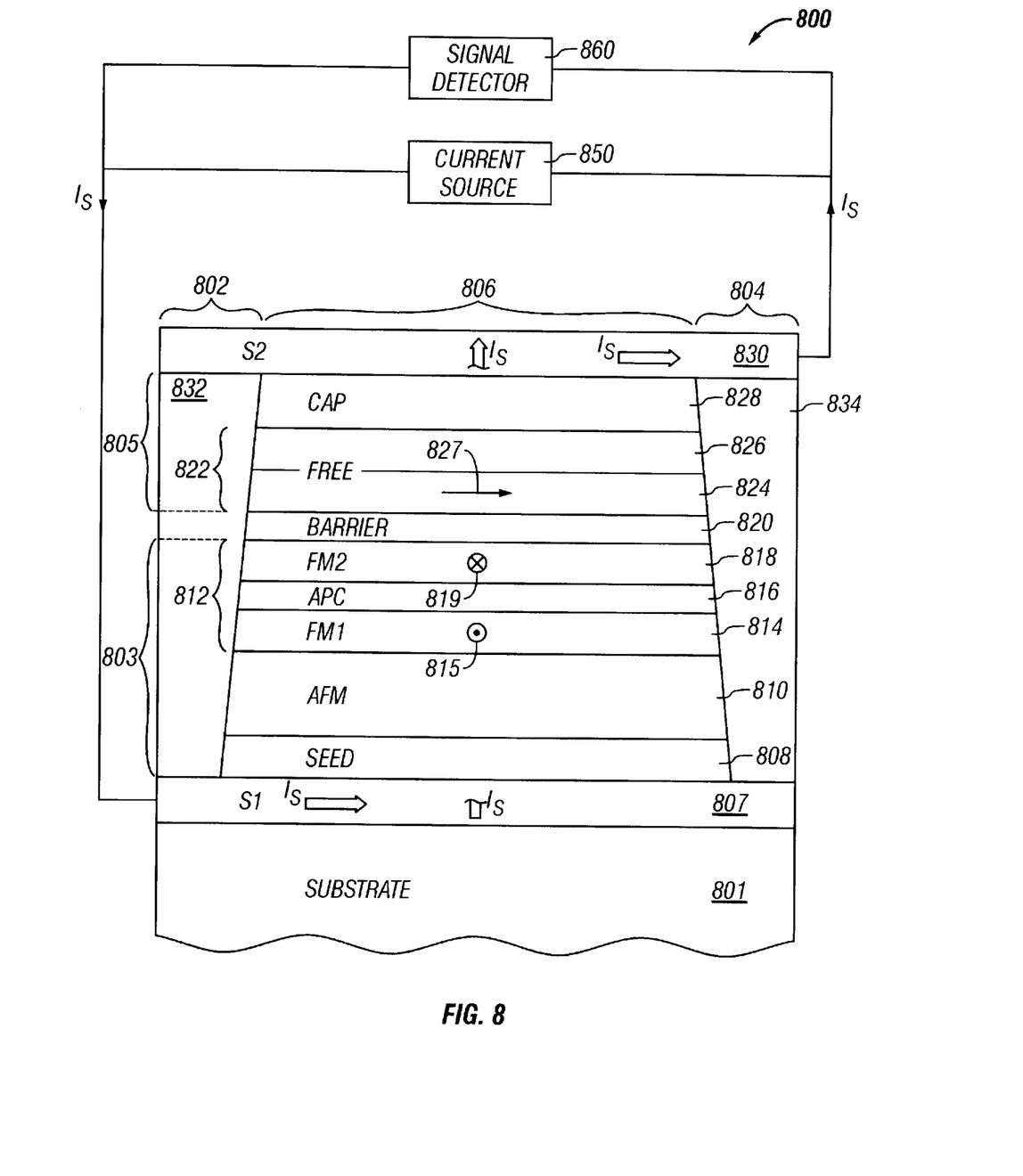
FIG. 8 is an air bearing surface view, not to scale, of an embodiment of an MTJ sensor of the present invention.

FIG. 8 shows an air bearing surface (ABS) view, not to scale, of a third example of an MTJ sensor 800 according to another embodiment of the present invention. The MTJ sensor 800 comprises passive end regions 802 and 804 separated from each other by an active central region 806. The active region of the MTJ sensor comprises a first electrode stack 803 and a second electrode stack 805 formed in the central region 806. The first and second electrode stacks 803 and 805 are separated by a tunnel barrier layer 820 which may over the central region 806 and the end regions 802 and 804. Alternatively, as shown in FIG. 8, the tunnel barrier layer 820 may be formed only in the central region 806. The first electrode stack 803 is formed directly on a first shield (S1) 807 in the central region 806. The first shield 807 is a layer of soft ferromagnetic material such as Ni—Fe (permalloy), or alternatively Al—Fe—Si (Sendust) deposited on a substrate 801 and extending over the central region 806 and end regions 802 and 804 to provide magnetic shielding of the MTJ sensor 800 from stray magnetic fields. The substrate 801 can be any suitable substance, including glass, semiconductor material, or a ceramic substance, such as alumina ($Al_2O_3$).

The first electrode stack 803 comprises an AP-pinned layer 812, an AFM layer 810 and a seed layer 808. The seed layer 808 is a nonmagnetic metal layer deposited to modify the crystallographic texture or grain size of the subsequent layers. The AFM layer 810 is exchange coupled to the AP-pinned layer 812 providing an exchange field to pin the magnetization direction of the AP-pinned layer 812 perpendicular to the ABS. The AP-pinned layer 812 comprises a first ferromagnetic (FM1) layer 814 adjacent to the AFM layer 810, a second ferromagnetic (FM2) layer 818 and an antiferromagnetic coupling (APC) layer 816 sandwiched between the FM1 and FM2 layers 814 and 818. The APC layer 816 is formed of a nonmagnetic material, preferably ruthenium (Ru), that allows the FM1 and FM2 layers 814 and 818 to be strongly coupled together antiferromagnetically.

The second electrode stack 805 comprises a laminated ferromagnetic free layer 822 adjacent to the tunnel barrier layer 820 and a cap layer 828. The laminated free layer 822 is a bilayer comprising a first sublayer 824 adjacent to the tunnel barrier layer and a second sublayer 826. The magnetization 827 of the laminated free layer 822 is oriented parallel to the ABS and is free to rotate in the presence of a magnetic field. Alternatively, the magnetization of the free layer may be oppositely directed to that shown in FIG. 8.

Insulator layers 832 and 834 of electrically insulating material such as $Al_2O_3$ are formed in the end regions 802 and 804, respectively, on the first shield 807 and in abutting contact with the MTJ sensor layers in the central region 806. A second shield 830 of soft ferromagnetic material such as Ni—Fe, or alternatively Al—Fe—Si, is formed over the insulator layers 832 and 834 in the end regions 802 and 804, respectively, and over the second electrode stack 805 in the central region 806.

If longitudinal stabilization of the magnetic domain states of the free layer 822 is desired, hard bias layers may be provided in the end regions 802 and 804 as is known in the art. IBM's U.S. Pat. No. 6,097,579 granted to Gill, and incorporated herein by reference, describes such a longitudinal biasing method for an MTJ sensor.

The first and second shields 807 and 830 serve as leads providing electrical connections for the flow of a sensing current $I_s$ from a current source 850 to the MTJ sensor 800. In the MTJ sensor, the sense current flows perpendicular to the plane (CPP) of layers forming the active portion of the sensor. A signal detector 860 which is electrically connected to the first and second shields 807 and 830 senses the change in resistance due to changes induced in the free layer 822 by the external magnetic field (e.g., field generated by a data bit stored on a disk). The external magnetic field acts to rotate the direction of magnetization 827 of the free layer 822 relative to the direction of magnetization 819 of the FM2 layer 818 (represented as the tail of an arrow pointing into the plane of the paper) which is preferably pinned perpendicular to the ABS. The signal detector 860 preferably comprises a partial response maximum liklihood (PMRL) recording channel for processing the signal detected by the MTJ sensor 800. Alternatively, a peak detect channel or a maximum liklihood channel (e.g., 1,7 ML) may be used. The design and implementation of the aforementioned channels are known to those skilled in the art. The signal detector 860 also includes other supporting circuitries such as a preamplifier (electrically placed between the sensor and the channel) for conditioning the sensed resistance changes as is known to those skilled in the art.

The MTJ sensor 800 may be fabricated in a magnetron sputtering or an ion beam sputtering system to sequentially deposit the multilayer structure shown in FIG. 8. The first shield 807 of Ni—Fe having a thickness in the range of 5000–10000 Å is deposited on the substrate 801. The seed layer 808, the AFM layer 810 and the AP-pinned 812 are sequentially deposited over the first shield 807 in the presence of a longitudinal or transverse magnetic field of about 40 Oe to orient the easy axis of all the ferromagnetic layers. The seed layer 808 formed of Ni—Fe—Cr having a thickness of about 25 Å is deposited on the first shield 807. The AFM layer 810 formed of Pt—Mn having a thickness of about 150 Å is deposited on the seed layer 808. The FM1 layer 814 formed of Co—Fe—X, where X is niobium (Nb) or hafnium (Hf) or a combination of niobium and hafnium (NbHf), having a thickness of about 13 Å is deposited on the AFM layer 810. The APC layer 816 formed of ruthenium (Ru) having a thickness of about 8 Å is deposited on the FM1 layer 814 and the FM2 layer 818 formed of Co—Fe—X having a thickness of about 20 Å is deposited on the APC layer. The tunnel barrier layer 820 is formed of $Al_2O_3$ by depositing and then plasma oxidizing an aluminum (Al) layer having a thickness of about 7 Å on the FM2 layer 818.

The ferromagnetic laminated free layer 822 is formed by depositing the first sublayer 824 of Co—Fe—X having a thickness of about 15 Å on the tunnel barrier layer 820 and depositing the second sublayer 826 of Ni—Fe—Y, where Y is tantalum (Ta) or chromium (Cr), having a thickness of about 15 Å on the first sublayer 824. The cap layer 828 formed of tantalum (Ta) having a thickness of about 40 Å is deposited on the free layer 822.

The MTJ sensor stack are defined in the central region 806 by depositing a photoresist and using photolithography and ion milling processes well known in the art. The insulator layers 832 and 834 can now be deposited on the first shield layer 807 in the end regions 802 and 804, respectively. The insulator layers 832 and 834 are formed of $Al_2O_3$ having a thickness approximately equal to the thickness of the MTJ sensor stack. The photoresist protecting the MTJ sensor stack is removed and the second shield 830 of Ni—Fe having a thickness in the range of 5000–10000 Å is formed on the cap layer 828 in the central region 806 and on the insulator layers 832 and 834 in the end regions 802 and 804, respectively.

After the deposition of the central portion 806 is completed, the sensor is annealed in the presence of a magnetic field of about 800 Oe oriented in the transverse direction to the ABS and is then cooled while still in the magnetic field to set the exchange coupling of the AFM layer 810 with the laminated AP-pinned layer 812 transverse to the ABS. The FM1 layer 814 has a surface which interfaces with a surface of the AFM layer 810 so that the AFM layer pins the magnetization 815 of the FM1 layer 814 in a direction perpendicular to and toward the ABS. The magnetization of the FM1 layer 814 is pinned in this direction by exchange coupling with the AFM layer 810. The APC layer 816 is very thin (about 8 Å) which allows an antiferromagnetic exchange coupling between the FM1 layer 814 and the FM2 layer 818. Accordingly, the magnetization 819 (represented by the tail of an arrow pointing into the plane of the paper) of the FM2 layer 818 is directed in an opposite direction to the magnetization 815 of the FM1 layer 614, namely perpendicular to and away from the ABS. Alternatively, the magnetization 815 of the FM1 layer 814 may be set in an opposite direction (perpendicular to and away from the ABS) so that the magnetization 815 points into the plane of the paper. The magnetization 819 of the FM2 layer 818 will then point out of the plane of the paper due to the antiparallel coupling across the APC layer 816.

DISCUSSION

Novel features of the present invention are the use of Co—Fe—X to form the ferromagnetic AP-pinned layers and the use of Ni—Fe—Y and Co—Fe—X to form the sublayers of the laminated free layers to improve the corrosion resistance of the GMR and MTJ sensors. After a lapping process to form the ABS of the slider, the edges of the stack of layers forming the GMR and MTJ sensors are exposed at the ABS to air, water vapor and other contaminants present in the disk drive enclosure. The Ni—Fe, Co, and Co—Fe ferromagnetic materials most commonly used for the free layers and pinned layers of the GMR and MTJ sensors of the prior art are the materials most susceptible to oxidation and corrosion leading to degradation and possible failure of the sensors over time. Substitution of corrosion resistant Co—Fe—X and Ni—Fe—Y materials for the corrosion susceptible materials of the prior art to form the ferromagnetic pinned layers and soft ferromagnetic free layers of GMR and MTJ sensors provides improved performance and reliability without compromising sensor GMR coefficients or other magnetic properties.

In the present invention, the corrosion resistive properties of any GMR or MTJ sensor may be improved by the use of Co—Fe—X for the material forming the pinned layers and Ni—Fe—Y and Co—Fe—X for the materials forming laminated bilayer free layers. In particular, the Co—Fe—X material is $(Co-Fe)_a-X_b$, where X=Nb, Hf or NbHf, $90\% \leq a \leq 95\%$, $5\% \leq b \leq 10\%$ and a+b=100%. The addition of 5–10 atomic wt. % of Nb, Hf or NbHf into Co—Fe improves corrosion resistance by a known self-passivation effect of the these alloys due to formation of a thin surface oxide which protects the metal surface from further degradation. Addition of these metals also results in a reduced grain size of the deposited FM1 and FM2 layers leading to an increase of the electrical resistivity of the layers. This increase in layer resistivity reduces sense current shunting through the AP-pinned structure resulting in an increased deltaR/R for the GMR sensors. The Ni—Fe—Y material is $(Ni-Fe)_a-Y_b$, where Y=Ta or Cr, $90\% \leq a \leq 95\%$, $5\% \leq b \leq 10\%$ and a+b=100%. The addition of 5–10 atomic wt. % of Ta or Cr into Ni—Fe improves the corrosion resistance and increases the electrical resistivity. Laminated free layer structures using sublayers formed of Co—Fe—X combined with sublayers formed of Ni—Fe—Y provides free layers having improved corrosion resistance and increased resistance without compromising the GMR coefficient and other magnetic properties.

While the present invention has been particularly shown and described with reference to the preferred embodiments, it will be understood to those skilled in the art that various changes in form and detail may be made without departing from the spirit, scope and teaching of the invention. Accordingly, the disclosed invention is to be considered merely as illustrative and limited only as specified in the appended claims.

I claim:

1. A spin valve (SV) magnetoresistive sensor comprising:
   an antiparallel (AP)-pinned layer comprising:
   a first ferromagnetic (FM1) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%;
   a second ferromagnetic (FM2) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%; and
   an antiferromagnetic coupling (APC) layer disposed between said FM1 and FM2 layers;
   a ferromagnetic free layer; and
   a spacer layer disposed between said FM2 layer and said free layer.

2. The spin valve (SV) magnetoresistive sensor as recited in claim 1, wherein said ferromagnetic free layer comprises:
   a first sublayer made of $(Co-Fe)_a-X_b$, wherein X is chosen from a group of materials consisting of niobium (Nb), hafnium (Hf) and niobium-hafnium (NbHf) $90\% \leq a \leq 95\%$, $5\% \leq b \leq 10\%$ and a+b=100%, said first sublayer adjacent to said spacer layer; and
   a second sublayer made of $(Ni-Fe)_a-Y_b$, wherein Y is either tantalum (Ta) or chromium (Cr), $90\% \leq a \leq 95\%$, $5\% \leq b \leq 10\%$ and a+b=100%.

3. The spin valve (SV) magnetoresistive sensor as recited in claim 1, wherein said SV sensor further includes an antiferromagnetic (AFM) layer adjacent to said FM1 layer.

4. The spin valve (SV) magnetoresistive sensor as recited in claim 3, wherein said AFM layer is made of Pt—Mn.

5. The spin valve (SV) magnetoresistive sensor as recited in claim 1, wherein said spacer layer is chosen from a group of materials consisting of CuO, copper (Cu), silver (Ag) and gold (Au).

6. A dual spin valve (SV) magnetoresistive sensor comprising:
   a first SV structure;
   a second SV structure; and
   a ferromagnetic free layer disposed between said first and second SV structures, said free layer providing a common free layer for said first and second SV structures;

said first SV structure further comprising:
  a first antiferromagnetic (AFM1) layer;
  a first antiparallel (AP)-pinned layer, comprising:
    a first ferromagnetic layer (FM1) adjacent to said AFM1 layer;
    a second ferromagnetic (FM2) layer;
    an antiparallel coupling layer disposed between said FM1 and FM2 layers; and
  a first spacer layer disposed between said FM2 layer and said free layer;
said second SV structure further comprising:
  a second antiferromagnetic (AFM2) layer;
  a second antiparallel (AP)-pinned layer, comprising:
    a fourth ferromagnetic layer (FM4) adjacent to said AFM2 layer;
    a third ferromagnetic (FM3) layer;
    an antiparallel coupling layer disposed between said FM3 and FM4 layers; and
  a second spacer layer disposed between said FM3 layer and said free layer; and
wherein said FM1, FM2, FM3 and FM4 layers are made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%.

7. The dual spin valve (SV) magnetoresistive sensor as recited in claim 1, wherein said free layer comprises:
  a first sublayer;
  a third sublayer; and
  a second sublayer disposed between said first and second sublayers, wherein said second sublayer is made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%; and
  wherein said first and third sublayers are made of $(Ni-Fe)_a-Y_b$, wherein Y is either tantalum (Ta) or chromium (Cr), $90\% \leq a \leq 95\%$, $5\% \leq b \leq 10\%$ and a+b=100%.

8. The dual spin valve (SV) magnetoresistive sensor as recited in claim 6, wherein said AFM1 and AFM2 layers are made of Pt—Mn.

9. The dual spin valve (SV) magnetoresistive sensor as recited in claim 6, wherein said first and second spacer layers are chosen from a group of materials consisting of CuO, copper (Cu), silver (Ag) and gold (Au).

10. A magnetic tunnel junction (MTJ) sensor, comprising:
  an antiparallel (AP)-pinned layer comprising:
    a first ferromagnetic (FM1) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%;
    a second ferromagnetic (FM2) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%; and
    an antiferromagnetic coupling (APC) layer disposed between said FM1 and FM2 layers;
  a ferromagnetic free layer; and
  a tunnel barrier layer disposed between said FM2 layer and said free layer.

11. The magnetic tunnel junction (MTJ) sensor as recited in claim 10, wherein said ferromagnetic free layer comprises:
  a first sublayer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%, said first sublayer adjacent to said tunnel barrier layer; and
  a second sublayer made of $(Ni-Fe)_a-Y_b$, wherein Y is either tantalum (Ta) or chromium (Cr), $90\% \leq a \leq 95\%$, $5\% \leq b \leq 10\%$ and a+b=100%.

12. The magnetic tunnel junction (MTJ) sensor as recited in claim 10, wherein said MTJ sensor further includes an antiferromagnetic (AFM) layer adjacent to said FM1 layer.

13. The magnetic tunnel junction (MTJ) sensor as recited in claim 12, wherein said AFM layer is made of Pt—Mn.

14. The magnetic tunnel junction (MTJ) sensor as recited in claim 10, wherein said tunnel barrier layer is made of $Al_2O_3$.

15. A magnetic read/write head comprising:
  a write head including:
    at least one coil layer and an insulation stack, the coil layer being embedded in the insulation stack;
    first and second pole piece layers connected at a back gap and having pole tips with edges forming a portion of an air bearing surface (ABS);
    the insulation stack being sandwiched between the first and second pole piece layers; and
    a write gap layer sandwiched between the pole tips of the first and second pole piece layers and forming a portion of the ABS;
  a read head including:
    a spin valve (SV) sensor, the SV sensor being sandwiched between first and second read gap layers, the SV sensor comprising:
      an antiparallel (AP)-pinned layer comprising:
        a first ferromagnetic (FM1) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b 100%;
        a second ferromagnetic (FM2) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%; and
        an antiferromagnetic coupling (APC) layer disposed between said FM1 and FM2 layers;
      a ferromagnetic free layer; and
      a spacer layer disposed between said FM2 layer and said free layer; and
    an insulation layer disposed between the second read gap layer of the read head and the first pole piece layer of the write head.

16. The magnetic read/write head as recited in claim 15, wherein said ferromagnetic free layer comprises:
  a first sublayer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and a+b=100%, said first sublayer adjacent to said spacer layer; and
  a second sublayer made of $(Ni-Fe)_a-Y_b$, wherein Y is either tantalum (Ta) or chromium (Cr), $90\% \leq a \leq 95\%$, $5\% \leq b \leq 10\%$ and a+b 100%.

17. A magnetic read/write head comprising:
  a write head including:
    at least one coil layer and an insulation stack, the coil layer being embedded in the insulation stack;

first and second pole piece layers connected at a back gap and having pole tips with edges forming a portion of an air bearing surface (ABS);

the insulation stack being sandwiched between the first and second pole piece layers; and a write gap layer sandwiched between the pole tips of the first and second pole piece layers and forming a portion of the ABS;

a read head including:
  a dual spin valve (SV) sensor, the SV sensor being sandwiched between first and second read gap layers, the dual SV sensor comprising:
    a first SV structure;
    a second SV structure; and
    a ferromagnetic free layer disposed between said first and second SV structures, said free layer providing a common free layer for said first and second SV structures;
    said first SV structure further comprising:
      a first antiferromagnetic (AFM1) layer;
      a first antiparallel (AP)-pinned layer, comprising:
        a first ferromagnetic layer (FM1) adjacent to said AFM1 layer;
        a second ferromagnetic (FM2) layer;
        an antiparallel coupling layer disposed between said FM1 and FM2 layers; and
      a first spacer layer disposed between said FM2 layer and said free layer;
    said second SV structure further comprising:
      a second antiferromagnetic (AFM2) layer;
      a second antiparallel (AP)-pinned layer, comprising:
        a fourth ferromagnetic layer (FM4) adjacent to said AFM2 layer;
        a third ferromagnetic (FM3) layer;
        an antiparallel coupling layer disposed between said FM3 and FM4 layers; and
      a second spacer layer disposed between said FM3 layer and said free layer; and
      wherein said FM1, FM2, FM3 and FM4 layers are made of $(Co-Fe)_a-X_b$, wherein X is chosen from a group of materials consisting of niobium, (Nb), hafnium (Hf) and niobium-hafnium (NbHf), $90\% \leq a \leq 95\%$, $5\% \leq b \leq 10\%$ and $a+b=100\%$; and an insulation layer disposed between the second read gap layer of the read head and the first pole piece layer of the write head.

18. The magnetic read/write head as recited in claim 17, wherein said ferromagnetic free layer comprises:
  a first sublayer;
  a third sublayer; and
  a second sublayer disposed between said first and second sublayers, wherein said second sublayer is made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and $a+b=100\%$; and
  wherein said first and third sublayers are made of $(Ni-Fe)_a-Y_b$, wherein Y is either tantalum (Ta) or chromium (Cr), $90\% \leq a \leq 95\%$, $5\% \leq b \leq 10\%$ and $a+b=100\%$.

19. A magnetic read/write head comprising:
a write head including:
  at least one coil layer and an insulation stack, the coil layer being embedded in the insulation stack;
  first and second pole piece layers connected at a back gap and having pole tips with edges forming a portion of an air bearing surface (ABS);
  the insulation stack being sandwiched between the first and second pole piece layers; and
  a write gap layer sandwiched between the pole tips of the first and second pole piece layers and forming a portion of the ABS;
a read head including:
  a magnetic tunnel junction (MTJ) sensor and first and second shield layers, the MTJ sensor being sandwiched between the first and second shield layers, the MTJ sensor comprising:
    an antiparallel (AP)-pinned layer comprising:
      a first ferromagnetic (FM1) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and $a+b=100\%$;
      a second ferromagnetic (FM2) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and $a+b=100\%$; and
      an antiferromagnetic coupling (APC) layer disposed between said FM1 and FM2 layers;
    a ferromagnetic free layer; and
    a tunnel barrier layer disposed between said FM2 layer and said free layer; and
  an insulation layer disposed between the second shield layer of the read head and the first pole piece layer of the write head.

20. The magnetic read/write head as recited in claim 19, wherein said ferromagnetic free layer comprises:
  a first sublayer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and $a+b=100\%$, said first sublayer adjacent to said tunnel barrier layer; and
  a second sublayer made of $(Ni-Fe)_a-Y_b$, wherein Y is either tantalum (Ta) or chromium (Cr), $90\% \leq a \leq 95\%$, $5\% \leq b \leq 10\%$ and $a+b=100\%$.

21. A disk drive system comprising:
a magnetic recording disk;
a magnetic read/write head for magnetically recording data on the magnetic recording disk and for sensing magnetically recorded data on the magnetic recording disk, said magnetic read/write head comprising:
  a write head including:
    at least one coil layer and an insulation stack, the coil layer being embedded in the insulation stack;
    first and second pole piece layers connected at a back gap and having pole tips with edges forming a portion of an air bearing surface (ABS);
    the insulation stack being sandwiched between the first and second pole piece layers; and
    a write gap layer sandwiched between the pole tips of the first and second pole piece layers and forming a portion of the ABS;
  a read head including:
    a spin valve (SV) sensor, the SV sensor being sandwiched between first and second read gap layers, the SV sensor comprising:
      an antiparallel (AP)-pinned layer comprising:
        a first ferromagnetic (FM1) layer made of $(Co-Fe)_a-X_b$, wherein X is chosen from a group of materials consisting of niobium (Nb), hafnium (Hf) and niobium-hafnium (NbHf), 90%≦a≦95%, 5%≦b≦10% and a+b=100%;

a second ferromagnetic (FM2) layer made of $(Co-Fe)_a-X_b$, wherein X is chosen from a group of materials consisting of niobium (Nb), hafnium (Hf) and niobium-hafnium (NbHf), 90%≦a≦95%, 5%≦b≦10% and a+b=100%; and an antiferromagnetic coupling (APC) layer disposed between said FM1 and FM2 layers;

a ferromagnetic free layer; and a spacer layer disposed between said FM2 layer and said free layer; and an insulation layer disposed between the second read gap layer of the read head and the first pole piece layer of the write head; and an actuator for moving said magnetic read/write head across the magnetic disk so that the read/write head may access different regions of the magnetic recording disk; and a recording channel coupled electrically to the write head for magnetically recording data on the magnetic recording disk and to the SV sensor of the read head for detecting changes in resistance of the SV sensor in response to magnetic fields from the magnetically recorded data.

22. The disk drive system as recited in claim 21, wherein said ferromagnetic free layer comprises:

a first sublayer made of $(Co-Fe)_a-X_b$, wherein X is chosen from a group of materials consisting of niobium (Nb), hafnium (Hf) and niobium-hafnium (NbHf), 90%≦a≦95%, 5%≦b≦10% and a+b=100%, said first sublayer adjacent to said spacer layer; and a second sublayer made of $(Ni-Fe)_a-Y_b$, wherein Y is either tantalum (Ta) or chromium (Cr), 90%≦a≦95%, 5%≦b≦10% and a+b=100%.

23. A disk drive system comprising:

a magnetic recording disk;

a magnetic read/write head for magnetically recording data on the magnetic recording disk and for sensing magnetically recorded data on the magnetic recording disk, said magnetic read/write head comprising:

a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;

a read head including:
a dual spin valve (SV) sensor, the SV sensor being sandwiched between first and second read gap layers, the dual SV sensor comprising:
a first SV structure;
a second SV structure; and
a ferromagnetic free layer disposed between said first and second SV structures, said free layer providing a common free layer for said first and second SV structures;
said first SV structure further comprising:
a first antiferromagnetic (AFM1) layer;
a first antiparallel (AP)-pinned layer, comprising:
a first ferromagnetic layer (FM1) adjacent to said AFM1 layer;
a second ferromagnetic (FM2) layer;
an antiparallel coupling layer disposed between said FM1 and FM2 layers; and
a first spacer layer disposed between said FM2 layer and said free layer;
said second SV structure further comprising:
a second antiferromagnetic (AFM2) layer;
a second antiparallel (AP)-pinned layer, comprising:
a fourth ferromagnetic layer (FM4) adjacent to said AFM2 layer;
a third ferromagnetic (FM3) layer;
an antiparallel coupling layer disposed between said FM3 and FM4 layers; and
a second spacer layer disposed between said FM3 layer and said free layer; and
wherein said FM1, FM2, FM3 and FM4 layers are made of $(Co-Fe)_a-X_b$, wherein X is chosen from a group of materials consisting of niobium (Nb), hafnium (Hf) and niobium-hafnium (NbHf), 90%≦a≦95%, 5%≦b≦10% and a+b=100%; and an insulation layer disposed between the second read gap layer of the read head and the first pole piece layer of the write head; and an actuator for moving said magnetic read/write head across the magnetic disk so that the read/write head may access different regions of the magnetic recording disk; and a recording channel coupled electrically to the write head for magnetically recording data on the magnetic recording disk and to the dual SV sensor of the read head for detecting changes in resistance of the dual SV sensor in response to magnetic fields from the magnetically recorded data.

24. The disk drive system as recited in claim 23, wherein said ferromagnetic free layer comprises:

a first sublayer;

a third sublayer; and a second sublayer disposed between said first and second sublayers, wherein said second sublayer is made of $(Co-Fe)_a-X_b$, wherein X is chosen from a group of materials consisting of niobium (Nb), hafnium (Hf) and niobium-hafnium (NbHf), 90%≦a≦95%, 5%≦b≦10% and a+b=100%; and wherein said first and third sublayers are made of $(Ni-Fe)_a-Y_b$, wherein Y is either tantalum (Ta) or chromium (Cr), 90%≦a≦95%, 5%≦b≦10% and a+b=100%.

25. A disk drive system comprising:

a magnetic recording disk;

a magnetic read/write head for magnetically recording data on the magnetic recording disk and for sensing magnetically recorded data on the magnetic recording disk, said magnetic read/write head comprising:

a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;

a read head including:
  a magnetic tunnel junction (MTJ) sensor and first and second shield layers, the MTJ sensor being sandwiched between the first and second shield layers, the MTJ sensor comprising:
    an antiparallel (AP)-pinned layer comprising:
      a first ferromagnetic (FM1) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and $a+b=100\%$;
      a second ferromagnetic (FM2) layer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and $a+b=100\%$; and
      an antiferromagnetic coupling (APC) layer disposed between said FM1 and FM2 layers;
    a ferromagnetic free layer; and
    a tunnel barrier layer disposed between said FM2 layer and said free layer; and
  an insulation layer disposed between the second shield layer of the read head and the first pole piece layer of the write head; and an actuator for moving said magnetic read/write head across the magnetic disk so that the read/write head may access different regions of the magnetic recording disk; and a recording channel coupled electrically to the write head for magnetically recording data on the magnetic recording disk and to the MTJ sensor of the read head for detecting changes in resistance of the MTJ sensor in response to magnetic fields from the magnetically recorded data.

26. The disk drive system as recited in claim 25, wherein said ferromagnetic free layer comprises:

a first sublayer made of $(Co-Fe)_a-X_b$, wherein X is chosen from a group of materials consisting of niobium (Nb), hafnium (Hf) and niobium-hafnium (NbHf), $90\% \leq a \leq 95\%$, $5\% \leq b \leq 10\%$ and $a+b=100\%$, said first sublayer adjacent to said tunnel barrier layer; and a second sublayer made of $(Ni-Fe)_a-Y_b$, wherein Y is either tantalum (Ta) or chromium (Cr), $90\% \leq a \leq 95\%$, $5\% \leq b \leq 10\%$ and $a+b=100\%$.

* * * * *